United States Patent
Röll et al.

(10) Patent No.: US 11,714,149 B2
(45) Date of Patent: Aug. 1, 2023

(54) METHOD FOR GENERATING AN MRI SEQUENCE, MRI METHOD AND MRI DEVICE

(71) Applicant: Neoscan Solutions GmbH, Magdeburg (DE)

(72) Inventors: Stefan Röll, Forchheim (DE); Christoph Dinh, Landau i.d. Pfalz (DE)

(73) Assignee: Neoscan Solutions GmbH, Magdeburg (DE)

( * ) Notice: Subject to any disclaimer, the term of this patent is extended or adjusted under 35 U.S.C. 154(b) by 0 days.

(21) Appl. No.: 17/539,624

(22) Filed: Dec. 1, 2021

(65) Prior Publication Data
US 2022/0171005 A1 Jun. 2, 2022

(30) Foreign Application Priority Data
Dec. 2, 2020 (DE) .......................... 102020132072.8

(51) Int. Cl.
G01R 33/38 (2006.01)
G01R 33/385 (2006.01)
G01R 33/54 (2006.01)
G01R 33/48 (2006.01)

(52) U.S. Cl.
CPC ....... G01R 33/385 (2013.01); G01R 33/4818 (2013.01); G01R 33/546 (2013.01)

(58) Field of Classification Search
CPC . G01R 33/385; G01R 33/4818; G01R 33/546
See application file for complete search history.

(56) References Cited

U.S. PATENT DOCUMENTS

2013/0249548 A1* 9/2013 Stemmer ................ G01R 33/44
324/309

OTHER PUBLICATIONS

Stocker, Tony, et al. "High-performance computing MRI simulations". Magnetic Resonance in Medicine, 64. Jg., Nr. 1, pp. 186-193, 2010.

* cited by examiner

Primary Examiner — G. M. A Hyder
(74) Attorney, Agent, or Firm — Volpe Koenig

(57) ABSTRACT

A method for generating an MRI sequence (1) which is characterized in that a first time segment type and a second time segment type differing therefrom are predefined and the MRI sequence (1) is constructed by time segments (5, 6) of the first time segment type and time segments (5, 6) of the second time segment type being strung together alternately.

17 Claims, 4 Drawing Sheets

METHOD FOR GENERATING AN MRI SEQUENCE, MRI METHOD AND MRI DEVICE

TECHNICAL FIELD

The invention relates to a method for generating a magnetic resonance imaging sequence, wherein the magnetic resonance imaging sequence comprises at least one radio-frequency transmission signal for a radio-frequency transmitting coil and a gradient signal for a gradient coil, wherein the magnetic resonance imaging sequence is constructed from a succession of time segments, each comprising time periods of a radio-frequency transmission signal and of a gradient strength of the gradient signal.

In the context of this invention, the term "magnetic resonance imaging" is abbreviated to "MRI" and the term "radio-frequency" is abbreviated to "RF".

Unless something to the contrary is explicitly disclosed, the word "a(n); one", insofar as it can indicate a number, should be understood in the sense of "at least one". In this regard, the abovementioned method can for example also comprise more than one gradient signal for a gradient coil. Since an MRI apparatus typically has three gradient coils, the MRI sequence will typically also comprise three gradient signals, one for each of the three coils.

The invention furthermore relates to an MRI method in which a generated MRI sequence is implemented. Moreover, the invention relates to an MRI apparatus comprising an RF system, a gradient system and a data processing system signal-connected to the RF system and the gradient system, wherein means are embodied which enable an MRI method described above to be carried out.

BACKGROUND

The abovementioned methods and devices are routine in practice and are used in sequence development and in the implementation of the developed sequences. In this case, the sequence developer is generally very free in the configuration of the sequence. In this case, the sequence developer can predefine in detail in principle with respect to any point in time what amplitude and phase the RF transmission signal is intended to have, what gradient strength the X-, Y- and Z-gradients are intended to have and when the MRI signal generated by a measurement object is intended to be picked up by the RF coil.

The great freedom available to the developer during sequence development has the consequence that developers must be experienced in sequence development since a multiplicity of dependencies exist and the MRI sequences generated are often not implementable. The developer therefore spends a very long time adapting the sequence developed by said developer in order that said sequence can ultimately be implemented.

SUMMARY

Against this background, the invention is based on the object of simplifying the development of MRI sequences.

In order to achieve this object, one or more of the features disclosed herein are utilized. In particular, therefore, according to the invention, in the case of a method for generating an MRI sequence of the type described in the introduction, in order to achieve the stated object it is proposed that a first time segment type and a second time segment type differing therefrom are predefined and that the MRI sequence is constructed by time segments of the first time segment type and time segments of the second time segment type being strung together alternately.

The succession of time segments is therefore composed of two different types of time segments which alternate in turns.

As a result of the introduction of different time segment types which alternate in turns, the developed sequence obtains a structure which allows the burden on the sequence developer to be considerably relieved, since functional conditions of the sequence can be assigned to the time segment types and the implementability of a sequence can thus be attained more simply, controlled better and checked more simply.

A time segment type can preferably be characterized in that time segments are assigned a property which all time segments of the relevant time segment type have. Time segments of different time segment types then differ in at least one of the properties assigned to them.

Provision can be made for numerical values representing the gradient strength and the RF transmission signal of the MRI sequence to be stored in a data memory, in particular with respect to time points of a time frame. In this case, the MRI sequence will already have been constructed or the storage is effected during the construction of said MRI sequence. Provision can be made for the corresponding values to be determined by a numerical simulation in which the constructed MRI sequence is implemented in a computer-aided manner. Furthermore, it is possible to store numerical values with respect to a time window for signal acquisition. This can be done for example section by section, completely, in a volatile buffer memory or in a non-volatile memory. The storage is preferably effected in a format that is readable by an MRI apparatus. The storage of the numerical values for the gradient strength and the RF control simplifies the implementation of the generated MRI sequence on an MRI apparatus.

Provision can be made for the constructed or generated sequence firstly to be stored in a compact format which as yet does not have numerical values for the gradient strength and the RF transmission signal. Preferably, the numerical values are determined from this format by means of an interpreter, which can also be implemented on the MRI apparatus. The values determined are then preferably buffer-stored at least temporarily and/or section by section for further use. An appropriate format is a JavaScript format, for example. The interpreter is then expediently one which can interpret JavaScript.

The method enables in this way a compact description of the sequence, said description generally having a size of only a few kbytes and being complete despite the small size. By way of example, the format of the sequence, which is preferably directly implementable by an MRI apparatus, can have a size of less than 50 kbytes, preferably less than 10 kbytes, particularly preferably less than 5 kbytes.

It can therefore be expedient for the storage of the MRI sequence, in particular a storage of the numerical values mentioned above, to be stored as an image attribute with an image recorded with the generated MRI sequence. This can have the advantage that, as a result, such an image can be generated for example later again with the same sequence.

Provision can be made for a data structure to be predefined for the generated MRI sequence and/or for objects of the generated MRI sequence such as in particular for the time segments and/or for the iterators and/or for the parameters and/or for the operators and/or for the RF and gradient elements. Provision can therefore be made, in particular, for the data structures of the time segments of the first and second time segment types to differ from one another.

In one advantageous development of the method, it can be provided that in the case of the first time segment type the gradient strength at a start and at an end of the time period of a time segment is freely selectable. Alternatively or additionally, it can be provided that in the case of the second time segment type the gradient strength at a start of the time period of a time segment is predefined by the gradient strength at an end of the time period of a directly temporally preceding time segment. Alternatively or additionally, it can be provided that in the case of the second time segment type the gradient strength at an end of the time period of a time segment is predefined by the gradient strength at a start of the time period of a directly temporally succeeding time segment.

A configuration in which the features of the abovementioned developments of the method according to the invention are realized simultaneously is particularly preferred. This has the consequence that the two time segment types are accorded a different role in the sequence development. Owing to the predefinition of connection conditions for the gradient strengths of the time segments of the second time segment type, with regard to these there are only limited possibilities for configuring the gradients in comparison with the time segments of the first time segment type.

The time segments of the first time segment type often serve for encoding the magnetization during the emission of RF pulses or during the readout of the magnetization. In order to carry out this encoding sufficiently accurately, it is often necessary to locally define the amplitudes of the gradients within the first time segment type and thus also at its start and end points. The time segments of the first type can be helpful even without RF pulses or readout windows, for example if other reasons dictate that the gradient amplitudes are intended to be fixed, such as at the value zero, for instance.

The time segments of the second time segment type, although not in every case, do frequently serve for encoding the magnetization in time segments in which the RF channels are empty, i.e. in which no RF pulse is emitted and no magnetization is read out either. This encoding task is often able to be formulated such that a small number of target variables are attained. By way of example, for stationary imaging objects, it is often already sufficient to predefine only the first-order gradient moment, i.e. the area beneath the gradient shape over time. For moving imaging objects, for example flowing blood, it can furthermore be expedient to predefine the second-order gradient moments as well, in order to attain a specific flow encoding. Further boundary conditions concerning the continuity of the gradient profiles can be added. The amplitude profile of gradient pulses of time segments of the second time segment type are regularly not predefined per se; said amplitude profile can be formulated as an optimization problem with one or more target variables and can therefore regularly be formulated as a boundary value problem which takes account of the fact the amplitudes of the adjoining time segments of the first time segment type are continuously connected. The optimization of such a gradient profile can be analytically calculated in advance or be determined numerically.

Time segments of the second time segment type can also be expediently useable when the RF channel is not empty, particularly when the magnetization is read out. Even if, in the case of such time segments, the amplitude profile can be provided such that the latter is determined by an optimization, it is possible—as soon as the calculation is concluded—to effect a calculation of the profile of the gradient strengths or of the k-space traversal analogously to the calculation in the case of the time segments of the first type. In practice, a frequent application of time segments of the second type with RF readout is "ramp sampling", in which MR signals are already recorded during the ramping up of a gradient pulse.

In a further advantageous configuration of the method, it can be provided that an iterator is predefined, comprising a partial succession of time segments, that a number of iterations is predefined or calculated and that the partial succession is iterated in accordance with the number of iterations. The use of iterators simplifies the sequence development since repetition of an identical scheme is a frequent occurrence in the case of MRI sequences.

Preferably, the iterator comprises at least one time segment of each of the two time segment types. Furthermore, the iterator preferably comprises a sub-iterator, which can itself comprise a partial succession of time segments. Further nesting levels are likewise possible.

The number of iterations is preferably greater than one. In specific cases, however, the use of a 1-iterator can also be expedient, that is to say of an iterator which is implemented only once, that is to say if the number of iterations just has the value 1.

An iterator is therefore accorded the task of implementing the time segments that it includes or further iterators at least once or repeatedly, as frequently occurs in the case of MRI sequences. In this case, the total implementation time of the time segments being implemented can be fixed at a value which is assigned to the iterator itself and acts as a boundary condition. If this boundary condition is not predefined, all elements that the iterator comprises determine their time durations themselves. If the boundary condition is predefined, provision is preferably made, in order to avoid time conflicts, for at least one of the time segments included to provide a variable duration. This time segment can then accommodate the remaining duration, such that the temporal boundary condition is satisfied.

A typical case for an iterator with more than one iteration and a temporal boundary condition is the realization of the so-called repetition time, in the case of which the temporal succession of iterations is often fixedly predefined in order to generate a constant contrast pattern in a settled state of the spin system. In that case, a time slice, for example a time segment of the second time segment type with empty gradient pulses of amplitude zero, includes the TR boundary condition of the iterator, and thus ensures that the time segments included are repeated exactly with the spacings TR, even if other time segments included possibly vary in terms of their durations depending on other iterators.

A further typical application of the iterator is a single implementation in conjunction with a predefined temporal boundary condition. The iterator acts as a time bracket in this application. In this regard, the succession of two time segments that the iterator comprises can be defined even when implemented once, specifically also for the case where individual time segments that are included are variable in the calculation of their own duration. Once again provision is preferably made for at least one time segment to accommodate the remaining duration of the boundary condition. A typical application for such a 1-iterator with a temporal boundary condition is the realization of an echo time. In this case, the time between an excitation RF pulse and a readout window is intended to be kept constant over the temporal progression of the sequence in order that a specific contrast pattern is generated once again in the settled state of the spin system. The exact time between the centre of the RF pulse and the centre of the readout window is determined in many cases.

Furthermore, provision is preferably made for a running variable to be provided, which, during an implementation of the MRI sequence, keeps count of the iteration loop that the iterator is in at the respective point in time. The counter can then form a parameter that can be useable for example as an input parameter for an operator.

The iterator preferably comprises a time parameter that specifies a time duration. The time duration preferably forms a temporal boundary condition for a time duration of an implementation of the partial succession of time segments. In this case, the boundary condition preferably defines a temporal upper limit or a fixed time duration. The iterators, in particular the 1-iterators, can therefore perform functions of the time management of the MRI sequence. By way of example, a TE value can be used as time parameter. Preferably and independently thereof, the duration of the time segments can be predefinable by the user or can be calculated by an operator. In this regard, the time parameter can be used for example as an input parameter for such an operator, which then ensures in a computer-aided manner that a predefined succession of time segments and/or all iterations are implemented within the time duration predefined by the time parameter. An advantage of 1-iterators is afforded in this context; in this regard, the time parameter and a suitable operator can ensure that the time segments that the 1-iterator comprises are implemented within the time duration predefined by the time parameter.

Provision can be made for the time parameter to be assigned to one of the time segments that the iterator comprises. Provision can be made for the temporal condition to be satisfied at the point in time of the implementation of the assigned time segment, in particular at the beginning thereof, in the middle or at the end of the assigned time segment.

The calculation of durations of time segments can be based on various methods. By way of example, provision can be made for determining the durations of time segments with an RF pulse or a readout window from a minimization problem that is to be solved within the time segment. By way of example, the minimization problem can consist in generating a shortest time segment which attains an excitation angle of 90° with a predefined slice-selective RF pulse shape. A further example of a minimization problem can consist in generating a shortest readout window which attains a specific resolution of a spatial encoding. The durations of time segment types of the second type can also be formulated as a minimization problem. By way of example, a minimization problem can consist in finding, while complying with connection boundary conditions, the shortest duration required to attain a predefined first-order gradient moment along a gradient axis. If durations of time segments are not determined by a minimization problem or otherwise restricted by properties of the hardware, provision will often be made for these to be freely selectable.

Further temporal limitations often come into play, however, which can be predefined by iterators as time parameters which can form a temporal boundary condition. Provision can be made for such time parameters to be assigned in principle to all time segments since generally only their minimum durations are limited by solving local boundary value problems, but they can be stretched for longer durations. In practical application, different time segments have different degrees of suitability for accommodating longer temporal boundary conditions. Segments with RF transmission pulses often have only limited suitability because the RF hardware is often only suitable for outputting short RF pulses. Segments with only gradient pulses are better suited because the associated hardware also provides for outputting longer pulses. A particular importance as filling segment is accorded to empty time segments, which are adjustable to arbitrary durations without hardware limitations.

It should be taken into account that the solution space for calculating a gradient moment for given boundary conditions is generally not convex. This can have the consequence that for specific boundary conditions and gradient moments there are indeed special solutions with minimal time requirements, but then there are also longer time windows for which there is no solution. There may also be a convex partial solution space with longer time windows. Provision can therefore preferably be made for excluding a non-convex part of the solution space for the calculation of time durations. This can be expedient particularly if a common possible time duration for three gradient axes is sought.

Provision can be made for points in time in a time segment to be determined by a centring parameter, which, by way of the value 0.5, for example, centrally places the exact points in time in the time segment. Other configurations are also possible in which the centring parameter assumes a value in the value range of 0 to 1. As a result, asymmetrical RF pulses or asymmetrical readout windows can be permitted, for example.

A further special feature of 1-iterators is due to their assignment of time segments. In this regard, provision is preferably made for only a complete time segment to be assignable to an iterator. In the case of a central centring parameter, however, the last half of the last segment no longer belongs to the accommodating iterator. That should be taken into account for example if a 1-iterator is directly succeeded by a further 1-iterator. What is accomplished in such cases is that the succeeding 1-iterator accommodates the unconsidered time duration of the last time segment of the preceding iterator in order to be able to completely represent a sequence timing by means of successive 1-iterators. Such an arrangement is helpful for example in the case of a spin-echo sequence, in which the entire echo time is split into a first interval between an excitation RF pulse and a refocusing RF pulse, and a second interval between the refocusing pulse and the readout window. Many refocusing pulses are constructed temporally symmetrically and therefore have a centrally centred effect. In this respect an expedient representation of this sequence is one in which, for example, a boundary condition of TE/2 is linked to a first 1-iterator, which comprises the time segments including the excitation RF pulse and the refocusing pulse, and in which a second TE/2 links to a directly succeeding 1-iterator, which preferably only includes the time segment—succeeding the refocusing pulse—of the second type as far as the readout window. In this case, provision can be made for the apparently missing second half of the refocusing pulse also to be added for calculation of the filling value for compliance with the boundary condition.

It is possible to predefine a centring parameter having for example a value of between 0 and 1, preferably a value of 0.5. Preferably in association with a 1-iterator, provision can be made for the first and/or the last time segment of the 1-iterator or else of a multiply implemented iterator to contribute only in a proportion that is defined by the centring parameter. It can also be provided here that for the case where two 1-iterators directly succeed one another and both comprise a restriction, a part of a last time segment of the first iterator that is not taken into account due to the centring parameter is taken into account in the directly succeeding iterator.

In a further advantageous configuration of the method, it can be provided that the MRI sequence comprises at least one time window for signal acquisition. In this case, the time window predefines at what points in time an MRI signal generated by a measurement object is picked up by an RF coil and processed.

In a further advantageous configuration of the method, it can be provided that RF elements are predefined, including a first RF element having information about the RF transmission signal and a second RF element having information about a time window for signal acquisition, and that for each time segment there exists at least one RF channel, to which at least one of the RF elements is assigned. The RF channel can also remain free, however, such that when the MRI sequence is implemented, an RF signal is not transmitted, nor is an RF signal acquired. Preferably, each time segment has exactly one RF channel. Preferably, at most one of the RF elements is assigned to an RF channel. In a preferred embodiment, either the first RF element or the second RF element is assigned to the RF channel or the RF channel remains free.

Alternatively or additionally, it can be provided that gradient elements are predefined, including a first gradient element for the first time segment type having information about the gradient signal and a second gradient element for the second time segment type having information about the gradient signal. Furthermore, in this case, for each time segment there exists at least one gradient channel, to which at least one of the gradient elements, preferably exactly one of the gradient elements, is assigned or which remains free, such that when the MRI sequence is implemented, no gradient field is generated. Preferably, either the first or the second gradient element is assigned to the at least one gradient channel or the gradient channel remains free. Furthermore, a gradient channel preferably exists for each gradient of an MRI apparatus, regularly therefore three gradient channels for the X-, Y- and Z-gradients.

By way of example, the information about the RF transmission signal can be a pulse shape, such as, for instance, a selective pulse, a non-specific, hard pulse, a spectrally selective pulse or else a transmission pulse shaped in any other way.

The information about the time window can consist in particular in whether or not a signal is picked up when the MRI sequence is implemented. This can be effected in particular by means of a numerical variable that is set to 1 if a pick-up is intended to take place, and is set to 0 if a pick-up is intended not to take place.

The information about the gradient signal, in particular with respect to the first time segment type, can be for example a gradient shape, such as, for example, a constant gradient or a gradient with respect to a spiral or radial k-space trajectory. The information about the gradient signal, in particular with respect to the second time segment type, can for example also be a predefinition that the gradient is intended to adopt a shape with which a predefined or calculated gradient moment is preferably generated in minimal time. In this case or as an alternative thereto, predefinitions can be made such as, for example, with respect to the gradient shape, e.g. that the gradient is intended to adopt a trapezoidal shape.

In a further advantageous configuration of the method, it can be provided that numerical parameters are predefined or calculated. The numerical parameters are preferably scalars.

By way of example, one parameter can influence or predefine a temporal duration of the time segments, one parameter can define a limit value for a condition, and one parameter can have an influence on the RF transmission signal and/or the gradient signal such as, for example, the predefinition of a maximum gradient or of a slew rate. In this case, one parameter can be in particular an input variable for an operator. The parameters can also include, besides statically predefined variables, dynamically changing variables such as, for example, monitor signals indicating the patient's respiration or heartbeat. With the use of dynamic input parameters, the method can dynamically adapt in real time to the state of the examination object, which can be a patient. One parameter can also be provided by a running variable of an iterator.

The parameters can preferably be accessed via a graphical user interface.

In a further advantageous configuration of the method, it can be provided that operators are predefined with which a new parameter is calculated from one or more parameters. In this case, the calculation can take place statically, i.e. already before the MRI sequence is implemented. The calculation can also take place dynamically during the implementation of the MRI sequence. In this case, an operator can also be dependent on an identical or on a different operator. However, circular arguments must be avoided, which can occur particularly if an operator is dependent on itself.

In one particularly advantageous configuration of the method, it can be provided that only limited predefinitions are available for generating the MRI sequence. In this regard, it can be provided that at most or exactly the following predefinitions are available. Predefinition of the succession of the first time segment type and of the second time segment type, predefinition of RF elements and gradient elements and the assignment thereof to time segments, predefinition of parameters and predefinition of operators. The predefinition of the succession of the time segments of the first and second time segment types can preferably also be effected using iterators. Such a configuration with a considerable limitation of the possible predefinitions has the particular advantage that sequence developers only have to predefine a small number of objects. The sequence development is considerably simplified as a result. At the same time, the predefinitions mentioned above are sufficient to enable an arbitrary MRI sequence to be generated, such that the design freedom is not limited despite simplification of the input possibilities.

In a further particularly advantageous configuration of the method, it can be provided that the MRI sequence is generated by means of a graphical user interface comprising graphical elements for iterators and/or for the time segments of the first and second time segment types and/or for RF elements and gradient elements. Furthermore, the graphical interface can also comprise fields for predefined parameters and/or for preferably modifiable operators. Such configurations considerably facilitate the generation of an MRI sequence.

In a further advantageous configuration of the method, it can be provided that after the MRI sequence has been constructed, a computer-aided check is made to ascertain whether said MRI sequence is implementable on an MRI apparatus. Preferably, for this purpose, technical limits of the MRI apparatus and/or limit values for magnetic fields generated and/or other safety limits are defined as parameters for the method. The proposed method is outstandingly suitable for ensuring from outset that a generated MRI sequence can actually be implemented on an MRI apparatus.

However, in exceptional cases, it can also result in a lack of implementability, for example if specific predefined gradient moments cannot be obtained on account of technical or safety-relevant predefinitions. Such a sequence can be implemented in a computer simulation, but will not be implementable in a real measurement situation. However, said real measurement situation can also be readjusted by predefinition of the corresponding limit values as parameters. It is therefore possible even then to effect a computer-aided check of the implementability of the MRI sequence for a concrete application.

In a further advantageous configuration of the method, it can be provided that a computer-aided optimization of the MRI sequence is carried out during or after construction of the MRI sequence. While a large number of automatic adaptations of the affected MRI sequence can already be performed, by way of parameters and operators used, while the MRI sequence is being designed, such as, for example, the generation of a gradient movement in minimal time, it can be expedient to perform specific optimizations by means of separate routines, such as, for instance, the correction for eddy current effects or the incorporation of measurement results from shimming.

In a further advantageous configuration of the method, it can be provided that from the constructed or generated MRI sequence reconstruction data are calculated in a computer-aided manner, wherein the reconstruction data are useable for an image reconstruction from an MRI signal generated from the generated MRI sequence. Preferably, the reconstruction data comprise a k-space trajectory calculated from gradient strengths of the constructed or generated MRI sequence. A person skilled in the art knows how such a calculation can be effected. By way of example, a numerical integration can be used for this purpose. Preferably, the calculated reconstruction data are stored in a data memory. Preferably, it is furthermore provided that with respect to the reconstruction data one or more further reconstruction parameters useable for the image reconstruction are stored. One parameter can be a nominal image resolution, for example. The nominal image resolution indicates the pixel size of a reconstructed image. The MRI signal can be generated in particular by the implementation of the generated MRI sequence on a magnetic resonance imaging apparatus. The configurations mentioned above are particularly advantageous since an image reconstruction is necessary for a diagnostic assessment of a signal and the method described above can already provide essential information required for the image reconstruction. In this case, image reconstruction is understood broadly and encompasses all representations in the object space of the measurement object, i.e. 2D images, 3D volume images, and also 1D frequency spectra.

Preferably, it is furthermore provided that the calculated reconstruction data and/or the reconstruction parameters sufficiently determine an image reconstruction. In this case, all information required for the image reconstruction has already been provided.

It can be provided that the calculated reconstruction data and/or the reconstruction parameters are stored together with the generated MRI sequence. Preferably, the MRI sequence and the reconstruction data and/or the reconstruction parameters are stored in a common data format.

It can furthermore be provided that an MRI signal is simulated from the constructed or generated MRI sequence by forward simulation. It can be provided that an image is then reconstructed from the simulated MRI signal by means of the reconstruction data. The forward simulation and/or the image reconstruction can be used for sequence checking or development, for example.

In order to achieve the object, furthermore, the features of the alternative independent claim directed to an MRI method are provided according to the invention. In particular, therefore, in order to achieve the stated object, in the case of an MRI method of the type mentioned in the introduction, the invention proposes that an MRI sequence is generated by means of a method embodied according to the invention, in particular as described above and/or according to any of the method claims directed to a method for generating an MRI sequence, and that the generated MRI sequence is implemented on an MRI apparatus.

In order to achieve the stated object, furthermore, the features of the alternative independent claim directed to an MRI apparatus are provided according to the invention. In particular, therefore, in order to achieve the stated object, in the case of an MRI apparatus of the type mentioned in the introduction, the invention proposes that the MRI apparatus is configured to carry out an MRI method embodied according to the invention, in particular as described above and/or according to any of the method claims directed to an MRI method.

The RF system of the MRI apparatus preferably comprises an RF transmitting coil and an RF receiving coil, wherein the RF transmitting coil and the RF receiving coil can also be embodied as a joint transmitting and receiving coil. The gradient system comprises at least one gradient coil, preferably the X-, Y- and Z-gradient coils. The data processing system preferably comprises a computing unit and/or a data memory and/or input and/or output means.

BRIEF DESCRIPTION OF THE DRAWINGS

The invention will now be described in greater detail on the basis of a few exemplary embodiments, but is not restricted to said few exemplary embodiments. Further variants and exemplary embodiments arise through combination of the features of individual or a plurality of claims among one another and/or with individual or a plurality of features of initial examples and/or above-described variant devices and methods.

In the figures:

FIG. 3 is implementable.

DETAILED DESCRIPTION

Figure 1:
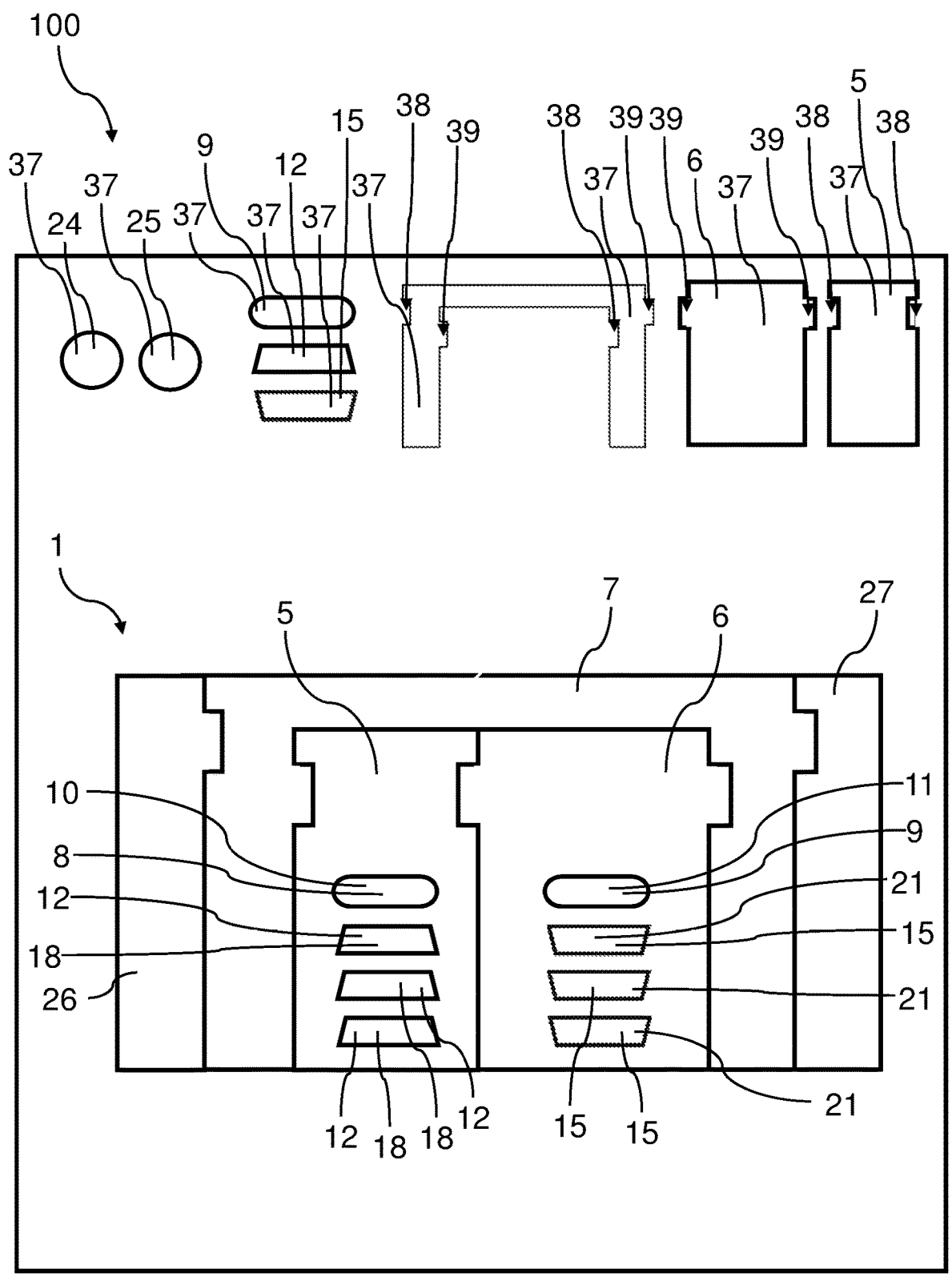
FIG. 1 shows a graphical user interface with a developed MRI sequence.

In the following description of the various exemplary embodiments of the invention, functionally corresponding elements, even with differing configuration or shaping, are given corresponding reference numerals.

FIG. 1 shows a graphical user interface 100 for the development of a MRI sequence 1. Graphical objects 37 representing the iterators 7, time segments 5, 6, RF elements 9, 10, gradient elements 12, 15 and parameters 24, 25 are arranged in the upper region of the interface 100.

In the lower region of the graphical user interface 100, an MRI sequence 1 has been generated from the graphical objects 37. The MRI sequence 1 has a sequence start 26 and a sequence end 27. An iterator 7 is arranged between the sequence start 26 and the sequence end 27, said iterator comprising a time segment 5 of a second time segment type and a directly adjoining time segment 6 of a first time segment type in the exemplary embodiment shown here.

The time segments 5 and 6 have a total of four channels, including one RF channel 10, 11 and a total of three gradient channels 18, 21, one for the readout gradient ("Gr"), one for the phase encoding gradient ("Gp") and one for the slice selection gradient ("Gs"). These three gradients are generated by the X-, Y- and Z-gradient coils in customary gradient systems.

Figure 3:
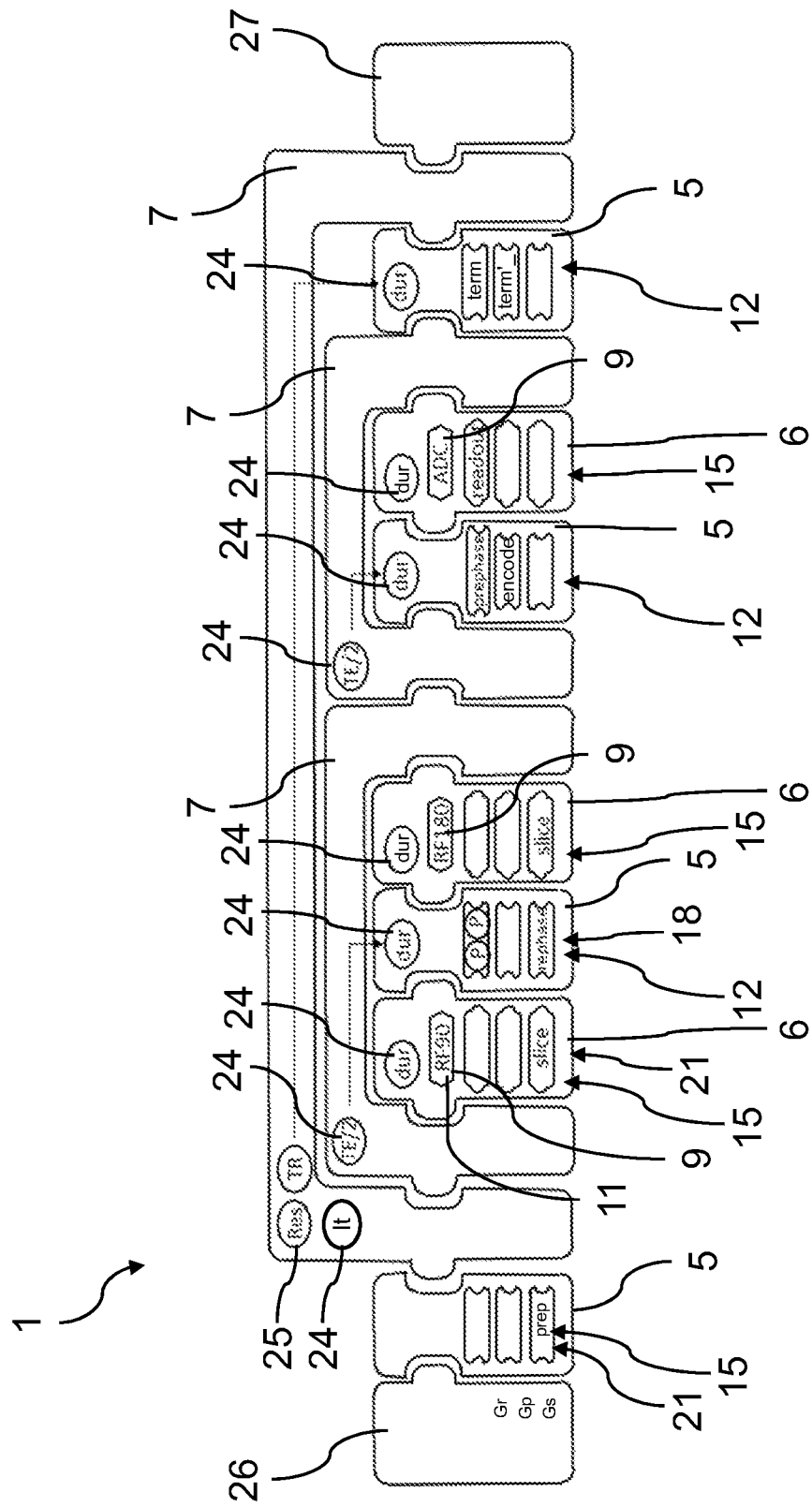
FIG. 3 shows an MRI sequence with respect to the sequence diagram from FIG. 2, said MRI sequence having been generated in accordance with the method embodied according to the invention.

The graphical user interface 100 allows the individual graphical objects 37 to be arranged in any desired manner between the sequence start 26 and the sequence end 27. It is possible for iterators 7 to be nested in one another, as is shown in FIG. 3, for example. However, time segments 5, 6 of the first and second time segment types must alternate in turns. To that end, for graphical illustration, iterators 7 and the time segments 5, 6 are embodied with corresponding recesses 38 and projections 39, which have to intermesh in the design of the MRI sequence 1.

Furthermore, it is possible to assign an RF element 8, 9 and respectively a gradient element 12, 15 to each channel 10, 11 and respectively 18, 21 of the time segments 5, 6 by an input means, such as a computer mouse, for example, being used to drag the corresponding graphical objects 37 to the corresponding location and place them there by means of drag-and-drop, for example.

In this case, it can be provided that a large number of different graphical objects 37 have already been arranged in the upper half of the graphical user interface 100 displayed, each of said graphical objects being allocated a concrete function, such as, for example, a trapezoidal gradient element 12, 15 or such as an RF element 8, 9 representing a slice-selective pulse.

Alternatively, it can also be provided that one of the properties of the corresponding element is assigned to the graphical object 37 by way of an option menu associated with a graphical object 37. By way of example, the different element types can be listed by means of a drop-down menu.

The same correspondingly applies to the parameters 24, 25, which can already be completely or partly represented as graphical elements 37 and can possibly also be selected by way of a menu.

Figure 2:
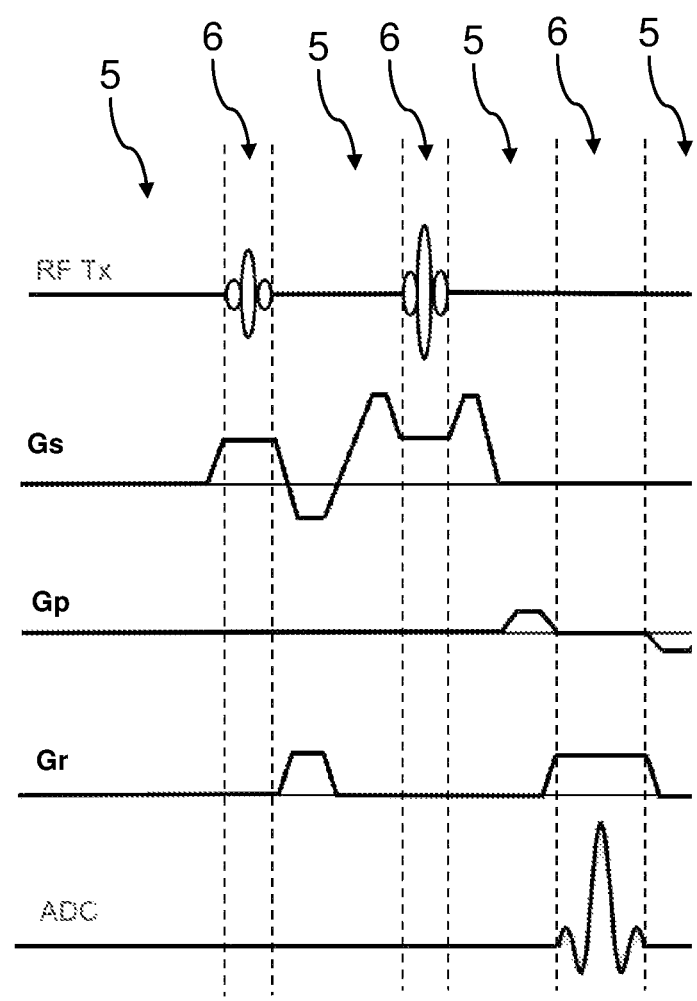
FIG. 2 shows a sequence diagram of a spin-echo sequence.

A concrete example of an MRI sequence 1 designed by means of the graphical user interface 100 is shown in FIG. 3. The associated sequence diagram is shown in FIG. 2. The sequence is a spin-echo sequence, as may be discerned without difficulty by a person skilled in the art. The sequence diagram comprises one row for the RF transmission channel ("RF tx"), one row each for the gradient strengths of the slice selection gradient ("Gs"), of the phase encoding gradient ("Gp") and of the readout gradient ("Gr"), and one row for the signal pick-up ("ADC").

In order to generate the MRI sequence 1, firstly a time segment 5 of a second time segment type and directly next to that an outer iterator 7 are arranged between the sequence start 26 and the sequence end 27. Two sub-iterators 7 embodied as 1-iterators are arranged sequentially within the outer iterator 7. A total of three time segments 5, 6 of alternating time segment types are arranged within the first sub-iterator 7. Two time segments 5, 6 of different time segment types are arranged in the second sub-iterator 7. A further time segment 5 of a second time segment type is arranged after the outer iterator 7.

In order to generate the MRI sequence 1, the sequence diagram in accordance with FIG. 2 is implemented by the RF channels 10, 11 and the gradient channels 18, 21 being filled with corresponding RF elements 8, 9 and gradient elements 12, 15. These are designated in FIG. 3 as "prep", "RF90", "slice", "P within a circle", "rephase", "RF180", "prephase", "encode", "ADC", "readout", "term" and "term", each of these elements fulfilling the function which is intended to be accorded to it in accordance with the sequence diagram from FIG. 2. By way of example, a 90° slice selection pulse RF element 9 ("RF90") is assigned to the RF channel 11 of the first time segment 6 of the first time segment type and a gradient element 15 with a constant gradient strength is assigned to the slice selection gradient channel 21 for the slice selection gradient ("Gs"). In order that the clarity of the overall view is not adversely affected, only selected elements are provided with corresponding reference signs in FIG. 3.

It should be noted that the gradient element 12 "encode" and consequently also the gradient element 12 "term" are dependent on the running variable "It", which forms a parameter 24 assigned to the outer iterator 7, since a different gradient strength of the phase encoding gradient ("Gp") is required for each k-space row.

In this case, the MRI sequence 1 shown in FIG. 3 has the properties described as follows. Time segments 5 of the first time segment type have the property that the gradient strengths at the start and end of the time segment 5 are freely selectable. This is different for the time segments 6 of the second time segment type. Here the gradient strength at the start of the time segment 6 is predefined by the gradient strength at the end of the preceding time segment 5 and the gradient strength at the end of the time segment 6 is predefined by the value of the gradient strength at the start of the succeeding time segment 5.

The number of iterations effected by the outer iterator 7 corresponds to the number of recorded k-space rows.

The time segments 5, 6 are each assigned a time parameter 24 "dur", which describes the time duration of the respective time segment 5, 6. The outer iterator 7 is assigned the time parameter 24 "TR", which corresponds to the chosen repetition time TR of the spin-echo sequence and is predefined by the user. The time parameter 24 brings about a temporal boundary condition for the outer iterator 7. It is ensured that the time segments 5, 6 encompassed by the outer iterator 7 are implemented in exactly the time predefined by the time parameter 24. In this case, said parameter 24 is assigned to the last time segment 5. This assignment has the effect that the time duration "dur" of this time segment 5 is automatically adapted such that the temporal boundary condition is complied with.

The sub-iterators 7 are likewise each assigned a time parameter 24, designated in both cases as "TE/2" in FIG. 3. These parameters 24 each correspond to half the echo time TE/2, where the echo time is predefined by the user. The time parameter 24 of the temporally first sub-iterator 7 is assigned to the central time segment 5, such that the time duration thereof is adapted in such a way that the 180° pulse of the succeeding time segment 6 is effected exactly half an echo time TE/2 after the 90° pulse of the preceding time segment 6. The time parameter 24 of the second sub-iterator 7 is assigned to the time segment 5 of the second time segment type, such that suitable adaptation of the time duration thereof ensures that the centre of the succeeding time segment 6, in which the refocused MR signal is read out, is effected exactly at the point in time TE.

For the MRI sequence 1, besides the parameters already mentioned above, even further parameters 24, 25 are stored, such as, for instance, for the maximum gradient strength achievable by the MRI apparatus 30 on which the MRI sequence 1 is intended to be implemented, and for the slew rate of the gradients. The gradient profile of the first time segment 5 can then be calculated therefrom in a computer-added manner. For this time segment 5, the gradient channel 18 with respect to the slice selection gradient ("Gs") is assigned a gradient element 12 with which the connection conditions at the start and at the end of the first time segment 5 are intended to be attained in minimal time. For this purpose, the parameter of the slew rate is required since the system then knows that the gradient is intended to be ramped up with the slew rate from zero to the constant value of the succeeding time segment 6. The duration of the first time segment 5 is therefore calculated according to the slew rate and the end value of the gradient strength.

The calculation is effected in a computer-aided manner in this case. For determining the strength of the succeeding time segment 6, an operator can be stored if the user merely predefines values from which the gradient strength can then be calculated.

Even further parameters 24, 25 can be stored for the MRI sequence 1. In particular, parameters 24, 25 can be stored which can be used for an image reconstruction from recorded MRI signals. By way of example, in the case of the MRI sequence 1, the parameter 25 "res" is stored, which corresponds to the nominal image resolution of the image reconstructed later.

During the generation of the MRI sequence 1, the user is restricted to the following objects.

The user can predefine iterators 7. The user can predefine the succession of the time segments 5, 6 of the first and second time segment types. The user can assign specific RF and gradient elements 8, 9, 12, 15 to the time segment 5, 6. The user can furthermore predefine parameters 24, 25. Moreover, operators are used for the generation of the MRI sequence 1. Further objects 37 do not exist.

In this case, the MRI sequence 1 can be designed completely by means of the graphical user interface 100. Once the MRI sequence 1 has been constructed, the user can instigate computer-aided checking and optimization of the MRI sequence 1, such that a check is made to ascertain whether the generated MRI sequence 1 satisfies all technical and safety-relevant conditions of the MRI apparatus 30 and of the magnetic fields generated by the latter. The MRI sequence 1 can be optimized for example for the correction of eddy current effects.

Figure 4:
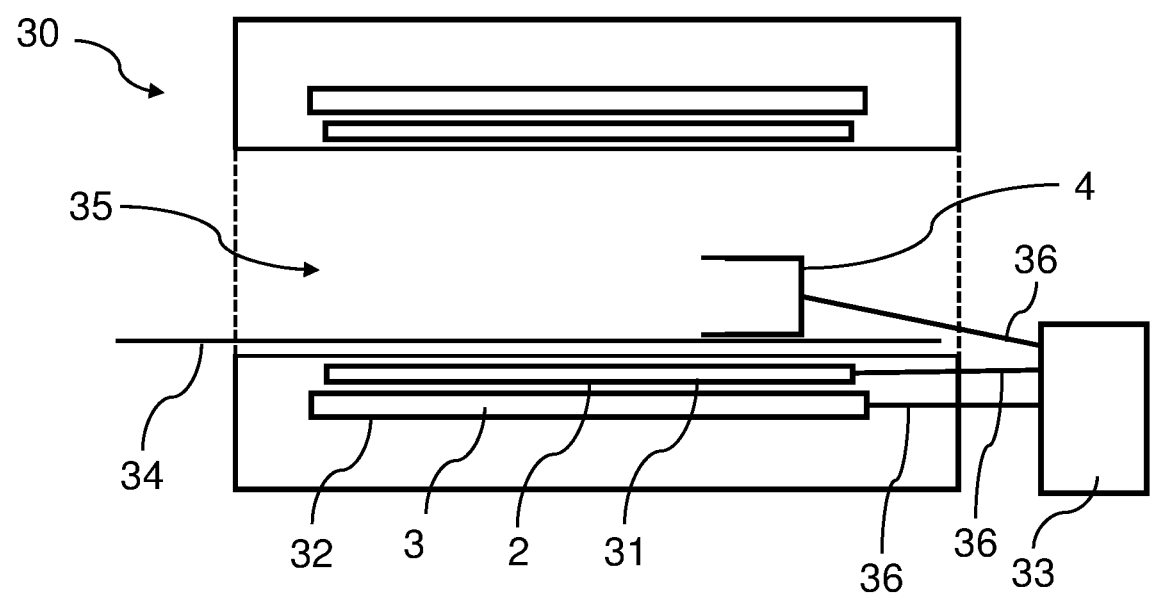
FIG. 4 shows an MRI apparatus on which the MRI sequence generated in FIG. 1

The method mentioned above can be carried out for example by means of the data processing system 33 shown in FIG. 4, using the resources of the data processing system 33. The latter comprises in particular a data memory, a processor and input and output means. In this regard, the graphical user interface 100 can be displayed on a computer screen, in particular, and for example a computer mouse can be used to interact with it.

FIG. 4 shows an MRI apparatus 30 having an RF system 31 comprising an RF transmitting coil 2 and an RF receiving coil 4. In addition, the MRI apparatus 30 has a gradient system 32 comprising three gradient coils 3, the gradient coils being provided by the X-, Y- and Z-gradients. The MRI apparatus 30 is a human scanner having a patient table 34, on which the RF receiving coil 4 is arranged and on which the measurement object, which can be a patient, in particular, is placed during the measurement. In this case, patient table 34 and RF receiving coil 4 are situated within a tube 35 in the MRI apparatus 30.

The data processing system 33 is connected to the gradient system 32 and the RF system 31 by means of data connections 36, which can be wired or wireless.

In this case, the MRI sequence 1 generated by the method described above can be stored in a form such that the MM sequence 1 can be implemented without further processing steps on the MRI apparatus 30. For this purpose, in particular, the values for the gradient strength and the control of the RF transmitting coil 2 and the time window for the signal acquisition can be stored in a format that is readable by the MRI apparatus 30.

Alternatively, provision can be made for the format in which the generated MRI sequence 1 is initially stored initially to be interpreted by an interpreter in order thus to generate the gradient strengths and the control signals for the RF transmitting coil. By way of example, the format can be a JavaScript format and the interpreter can be set up on the data processing system 33, for example.

In summary, the invention relates to a method for generating an MRI sequence 1 which is characterized in that a first time segment type and a second time segment type differing therefrom are predefined and in that the MRI sequence 1 is constructed by time segments 5, 6 of the first time segment type and time segments 5, 6 of the second time segment type being strung together alternately.

LIST OF REFERENCE SIGNS

1 MRI sequence
2 RF transmitting coil
3 Gradient coil
4 RF receiving coil
5 Time segment
6 Further time segment
7 Iterator
8 RF element
9 Further RF element
10 RF channel of 5
11 RF channel of 6
12 Gradient element
15 Further gradient element
18 Gradient channel of 5
21 Gradient channel of 6
24 Parameter
25 Further parameter
26 Sequence start
27 Sequence end
30 MRI apparatus
31 RF system
32 Gradient system
33 Data processing system
34 Patient table
35 Tube
36 Data connection
37 Graphical object
38 Recess
39 Projection
100 Graphical user interface

The invention claimed is:

1. A method for generating an MRI sequence (1), wherein the MRI sequence (1) comprises at least one RF transmission signal for an RF transmitting coil (2) and a gradient signal for a gradient coil (3), the method comprising:

constructing the MRI sequence (1) from a succession of time segments (5, 6), each comprising time periods of an RF transmission signal and of a gradient strength of the gradient signal;

predefining a first time segment type and a second time segment type differing therefrom;

the constructing of the MRI sequence (1) includes alternately stringing together the time segments (5, 6) of the first time segment type and the time segments (5, 6) of the second time segment type; and predefining an iterator (7), comprising a partial succession of the time segments (5, 6), predefining or calculating a number of iterations, and iterating the partial succession in accordance with the number of iterations.

2. The method according to claim 1, wherein at least one of: for the first time segment type, the gradient strength at a start and at an end of a time period of the time segment (5, 6) is freely selectable; for the second time segment type, the gradient strength at a start of a time period of the time segment (5, 6) is predefined by the gradient strength at an end of the time period of a directly temporally preceding one of the time segments (5, 6); or for the second time segment type, the gradient strength at an end of a time period of the time segment (5, 6) is predefined by the gradient strength at a start of the time period of a directly temporally succeeding one of the time segments (5, 6).

3. The method according to claim 1, further comprising predefining or calculating numerical parameters (24, 25) that at least one of influence a temporal duration of the time segments (5, 6), act as limit values for conditions, influence the RF transmission signal, influence the gradient signal, or act as input variables for operators.

4. The method according to claim 1, wherein for generating the MRI sequence (1), the predefining steps are limited to:

the predefining of the succession of the time segments (5, 6) of the first and second time segment types, predefining of RF and gradient elements (8, 9, 12, 15) and assigning the RF and gradient elements to the time segments (5, 6), predefining of parameters (24, 25) that at least one of influence a temporal duration of the time segments (5, 6), act as limit values for conditions, influence the RF transmission signal, influence the gradient signal, or act as input variables for operators, and predefining of operators with which a new parameter (24, 25) is calculated from the one or more parameters (24, 25).

5. The method according to claim 1, further comprising generating the MRI sequence (1) by a graphical user interface (100) comprising graphical elements (5 to 27) for at least one of iterators (7), the time segments (5, 6) of the first and second time segment types, or RF elements (8, 9) and gradient elements (12, 15).

6. The method according to claim 1, further after the MRI sequence (1) has been constructed, conducting a computer-aided check to ascertain whether said MRI sequence is implementable on an MRI apparatus (30).

7. The method according to claim 6, wherein the computer-aided check includes determining whether at least one of technical limits of the magnetic resonance imaging apparatus or limit values for magnetic fields generated are defined as parameters for the method.

8. The method according to claim 1, further comprising carrying out a computer-aided optimization of the MRI sequence during or after construction of the MRI sequence.

9. The method according to claim 1, further comprising from the constructed or generated MRI sequence, calculating reconstruction data, and using the reconstruction data for an image reconstruction from an MRI signal generated from the generated MRI sequence.

10. The method according to claim 9, wherein at least one of (a) the reconstruction data comprise a k-space trajectory calculated from gradient strengths of the constructed or generated MRI sequence or (b) with respect to the reconstruction data further reconstruction parameters useable for image reconstruction are stored.

11. A magnetic resonance imaging method, comprising generating an MRI sequence (1) using the method according to claim 1, and implementing the generated MRI sequence (1) on a magnetic resonance imaging apparatus (30).

12. An MRI apparatus (30) comprising an RF system (31), a gradient system (32) and a data processing system (33) signal-connected to the RF system (31) and the gradient system (32), wherein the MRI apparatus (30) is configured to carry out the magnetic resonance imaging method according to claim 11.

13. The method according to claim 1, wherein the iterator (7) comprises a time parameter forming a temporal boundary condition for a time duration of an implementation of the partial succession of time segments (5, 6).

14. A method for generating an MRI sequence (1), wherein the MRI sequence (1) comprises at least one RF transmission signal for an RF transmitting coil (2) and a gradient signal for a gradient coil (3), the method comprising:

constructing the MRI sequence (1) from a succession of time segments (5, 6), each comprising time periods of an RF transmission signal and of a gradient strength of the gradient signal;

predefining a first time segment type and a second time segment type differing therefrom;

the constructing of the MRI sequence (1) includes alternately stringing together the time segments (5, 6) of the first time segment type and the time segments (5, 6) of the second time segment type; and at least one of:

a) predefining RF elements (8, 9), including
a first RF element (8, 9) having information about the RF transmission signal,
a second RF element (8, 9) having information about a time window for signal acquisition, and for each said time segment (5, 6) there exists at least one RF channel (10, 11), to which at least one of the RF elements (8, 9) is assigned or which remains free, such that an RF signal is not transmitted, nor is an RF signal acquired, or b) predefining gradient elements (12, 15), including
a first gradient element (12, 15) for the first time segment type having information about the gradient signal,
a second gradient element (12, 15) for the second time segment type having information about the gradient signal, and for each said time segment (5, 6) there exists at least one gradient channel (18, 21), to which one of the gradient elements (12, 15) is assigned or which remains free, such that no gradient is generated.

15. The method according to claim 14, wherein the RF elements are predefined, and either the first RF element (8, 9) or the second RF element (8, 9) is assigned to the RF channel (10, 11) or the RF channel (10, 11) remains free.

16. The method according to claim 14, wherein the gradient elements are predefined, and either the first or the second gradient element (12, 15) is assigned to the at least one gradient channel (18, 21) or the gradient channel (18, 21) remains free.

17. A method for generating an MRI sequence (1), wherein the MRI sequence (1) comprises at least one RF transmission signal for an RF transmitting coil (2) and a gradient signal for a gradient coil (3), the method comprising:
- constructing the MRI sequence (1) from a succession of time segments (5, 6), each comprising time periods of an RF transmission signal and of a gradient strength of the gradient signal;
- predefining a first time segment type and a second time segment type differing therefrom;
- the constructing of the MRI sequence (1) includes alternately stringing together the time segments (5, 6) of the first time segment type and the time segments (5, 6) of the second time segment type; and
- predefining operators with which a new parameter (24, 25) is calculated from one or more parameters (24, 25).

* * * * *